United States Patent [19]

Na

[11] Patent Number: 5,797,086
[45] Date of Patent: Aug. 18, 1998

[54] METHOD FOR TUNING CHANNELS IN A VOLTAGE SYNTHESIZER TUNING CIRCUIT

[75] Inventor: Il Goo Na, Kwangmyung, Rep. of Korea

[73] Assignee: Samsung Electronics Co., Ltd., Kyungki-do, Rep. of Korea

[21] Appl. No.: 738,067

[22] Filed: Oct. 25, 1996

[30] Foreign Application Priority Data

Oct. 26, 1995 [KR] Rep. of Korea ............ 95-37404

[51] Int. Cl.⁶ ........................................ H04B 1/18
[52] U.S. Cl. ........................ 455/179.1; 455/184.1; 455/197.2
[58] Field of Search .................. 455/179.1, 180.1, 455/180.2, 180.3, 180.4, 183.1, 183.2, 184.1, 185.1, 190.1, 191.3, 197.2, 196.1, 120, 150.1, 161.1, 182.3; 375/326, 327, 329, 334, 344, 345, 375, 376; 327/105, 141; 348/731

[56] References Cited

U.S. PATENT DOCUMENTS

| | | | |
|---|---|---|---|
| 3,593,154 | 7/1971 | Blass | 455/179.1 |
| 4,058,772 | 11/1977 | Mogi et al. | 455/179.1 |
| 4,160,213 | 7/1979 | Carter | 455/180.4 |
| 4,187,467 | 2/1980 | Cammings | 455/115 |
| 4,264,976 | 4/1981 | Yamashita | 455/179.1 |
| 4,404,686 | 9/1983 | Moon | 455/180.2 |
| 4,450,587 | 5/1984 | Beyers, Jr. | 455/182.3 |

*Primary Examiner*—Reinhard J. Eisenzopf
*Assistant Examiner*—Edan Orgad
*Attorney, Agent, or Firm*—Sughrue, Mion, Zinn, Macpeak & Seas, PLLC

[57] ABSTRACT

A method for tuning to channels in a voltage synthesizer tuning circuit. Pulse width modulation data corresponding to an average error value of a variable capacitance diode is set to cope with an error of a tuning voltage varying with an error of the variable capacitance diode. An initial channel is tuned on the basis of an average value of the set pulse width modulation data and an automatic fine tuning operation is performed while the set pulse width modulation data is varied. The error of the variable capacitance diode is determined by comparing the average value of the set pulse width modulation data with the varied step. The set pulse width modulation data is corrected by such a value that can cope with upper and lower limit values of the determined error of the variable capacitance diode and then output to a tuner driver. The subsequent channel is tuned on the basis of the corrected pulse width modulation data. The set and corrected pulse width modulation data are stored in a memory and then output so that the subsequent channel can be tuned. A frequency of the tuned channel is displayed on a screen.

3 Claims, 6 Drawing Sheets

IF= fosc- RF

OSCILLATING FREQUENCY (FOSC)

DEPLETION REGION $$fosc = \frac{1}{2\pi\sqrt{LCd}}$$

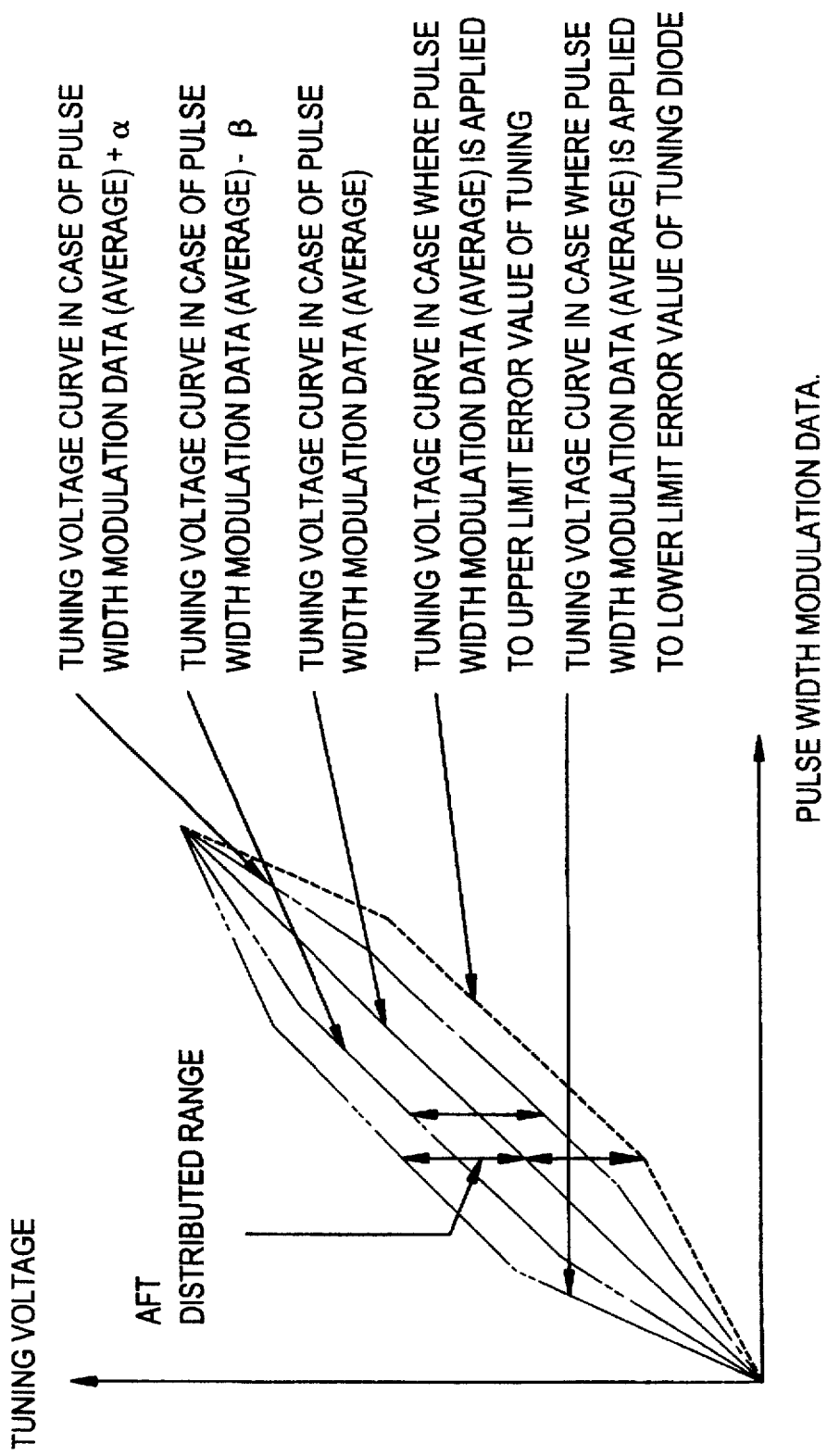

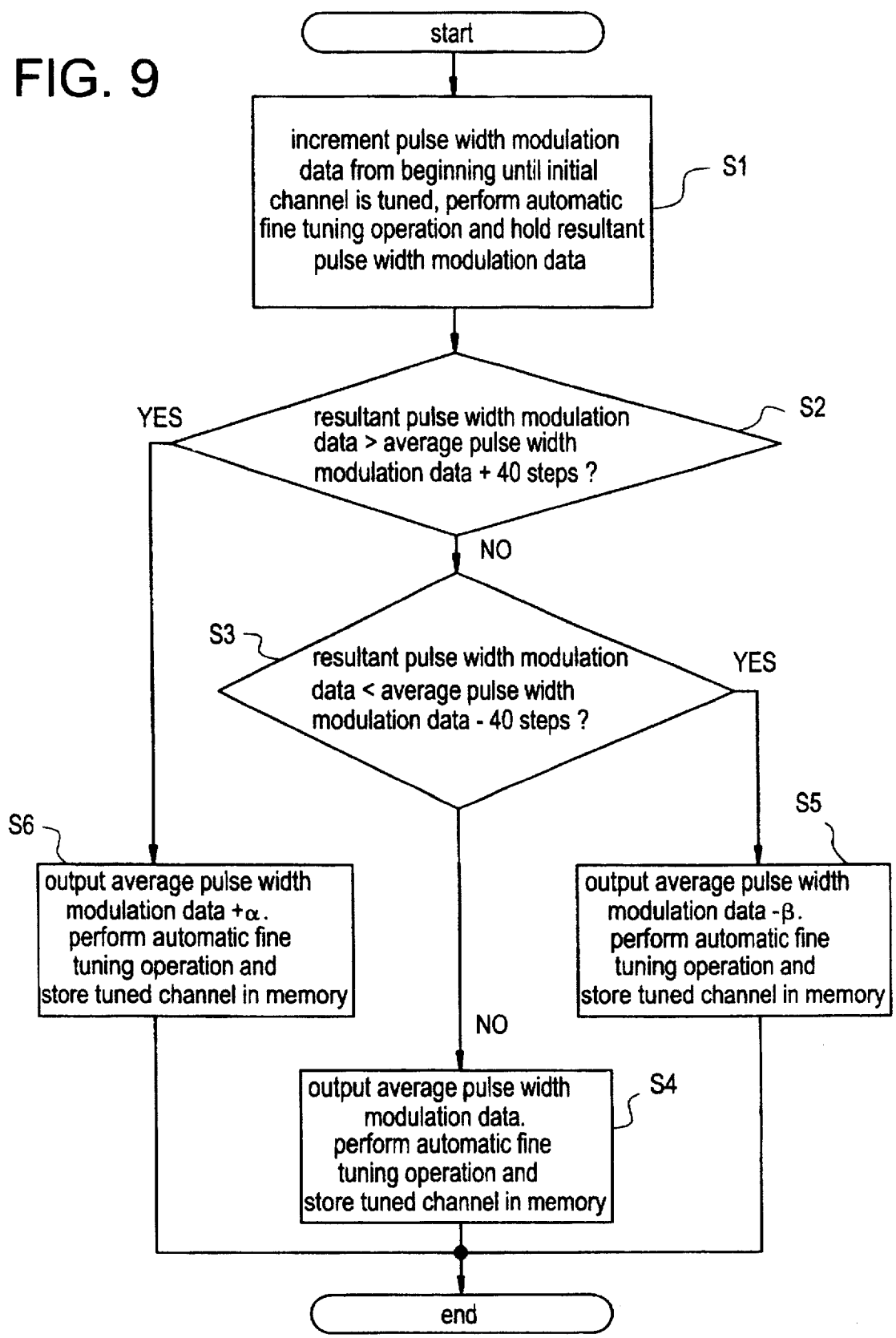

METHOD FOR TUNING CHANNELS IN A VOLTAGE SYNTHESIZER TUNING CIRCUIT

BACKGROUND OF THE INVENTION

1. Field of the Invention

The present invention relates to channel tuning methods, and more particularly, to a method for tuning to channels in a voltage synthesizer tuning circuit, in which the concept of a frequency synthesizer tuning method is introduced in the voltage synthesizer tuning method to reduce channel tuning time.

2. Description of the Prior Art

Channel tuning methods are generally classified into voltage synthesizer tuning methods V/S and frequency synthesizer tuning methods F/S.

In the voltage synthesizer tuning method V/S, an output voltage VT from a tuner driver, which controls an oscillating frequency fosc, is directly applied to a tuner. The frequency synthesizer tuning method F/S is adapted to control the oscillating frequency fosc using the principle of a phase locked loop (PLL).

FIG. 1 is a schematic block diagram illustrating the general channel tuning principle. As shown in FIG. 1, a desired broadcasting frequency RF (radio frequency) is mixed with the oscillating frequency fosc to convert the broadcasting frequency RF into an intermediate frequency IF. The resultant broadcasting signal of intermediate frequency IF can be expressed as follows:

IF=fosc−RF.

FIG. 2A illustrates the construction of a PN junction variable capacitance diode or tuning diode used to implement the channel tuning principle shown in FIG. 1. FIG. 2B is a graph illustrating a capacitance characteristic of the variable capacitance diode illustrated in FIG. 2A. If a reverse voltage Vr is applied to the variable capacitance diode as shown in FIG. 2A, the capacitance Cd of the variable capacitance diode is nonlinearly varied in inverse proportion to the reverse voltage Vr as shown in FIG. 2B. An oscillating frequency generation circuit of the tuner employing such a variable capacitance diode is shown in FIG. 3.

As shown in FIG. 3, the oscillating frequency fosc can be expressed as follows:

$$(fosc) = \frac{1}{(2\pi \sqrt{LC})}.$$

Table 1 shows the differences between the voltage synthesizer tuning method V/S and the frequency synthesizer tuning method F/S.

TABLE 1

| COMPARISON NO ITEMS | FREQUENCY SYNTHESIZER TUNING METHOD | VOLTAGE SYNTHESIZER TUNING METHOD |
|---|---|---|
| 1 CHANNEL TUNING METHOD | FREQUENCY CONTROL fosc = fr × 8(3M + S) NTSC - 4.0MHz/512 PAL = 3.2MHz/512 M: 9bit main counter S: 5bit swallow counter M and S are | VOLTAGE CONTROL Accurate PWM DATA is determined with respect to one channel after tuning. |

TABLE 1-continued

| COMPARISON NO ITEMS | FREQUENCY SYNTHESIZER TUNING METHOD | VOLTAGE SYNTHESIZER TUNING METHOD |
|---|---|---|
| 2 CHANNEL TUNING TIME | determined with respect to one channel before tuning Stored M and S are used. SHORT | BAND is turned from the lowest frequency. |
| 3 ADVANTAGES | It is convenient to use. A desired channel can be tuned at once. | The cost is lower than that of the frequency synthesizer tuning method. There is required no channel data of every broadcasting system. |
| 4 DISADVANTAGES | Various M and S must be stored according to broadcasting systems. It is complex to produce. | It is inconvenient to use because the channel tuning time is long. |

As seen from Table 1 above, the voltage synthesizer tuning method V/S has a much higher productivity than that of the frequency synthesizer tuning method F/S. However, the voltage synthesizer tuning method V/S is inconvenient to use because it requires a long channel tuning time.

Further, much time is required in tuning broadcasting channels at the production stage employing the voltage synthesizer tuning method V/S. For this reason, the processing time is increased, resulting in a reduction in the efficiency of production.

SUMMARY OF THE INVENTION

The present invention has been designed to overcome the above-mentioned problems. Therefore, it is an object of the present invention to provide a method for tuning to channels in a voltage synthesizer tuning circuit, in which the concept of a frequency synthesizer tuning method is introduced to reduce channel tuning time.

In accordance with the present invention, the above and other objects can be accomplished by providing a method for tuning to channels comprising the steps of setting pulse width modulation data corresponding to an average error value of a variable capacitance diode to cope with an error resulting from variations in the tuning voltage with an error of the variable capacitance diode; tuning to an initial channel on the basis of an average value of the pulse width modulation data, performing an automatic fine tuning operation while varying the pulse width modulation data to obtain resultant pulse width modulation data, and comparing the average value of the pulse width modulation data with the average value of the varied pulse width modulation data to determine the error of the variable capacitance diode; correcting the pulse width modulation data by a correction value, that can cope with upper and lower limit values of the error of the variable capacitance diode, determined in the second step, outputting the corrected pulse width modulation data to a tuner driver; and tuning to the subsequent channel on the basis of the corrected pulse width modulation data.

BRIEF DESCRIPTION OF THE DRAWINGS

The above and other objects, features and advantages of the present invention will be more clearly understood from the following detailed description taken in conjunction with the accompanying drawings, in which:

FIG. 8 is a graph illustrating the relationship between the pulse width modulation data and the tuning voltage based on α and β; and FIG. 9 is a flowchart illustrating the operation of the microcomputer illustrated in FIG. 5.

DETAILED DESCRIPTION OF THE PREFERRED EMBODIMENTS

Figure 5:
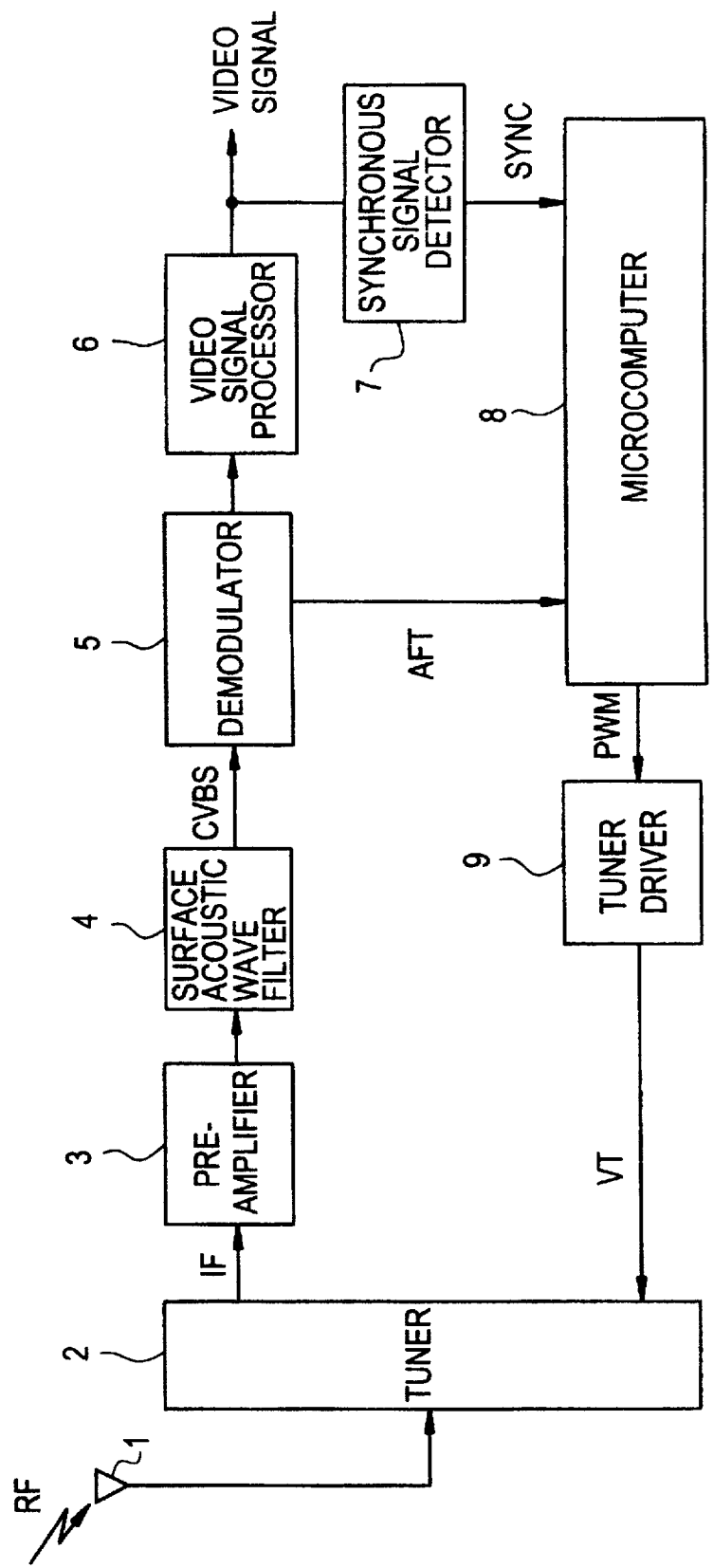
FIG. 5 is a schematic block diagram illustrating the construction of a voltage synthesizer tuning circuit which performs the tuning in accordance with the present invention.

FIG. 5 is a schematic block diagram illustrating the construction of a voltage synthesizer tuning circuit for tuning to channels according to a voltage synthesizer tuning method in accordance with the present invention. As shown in FIG. 5, the voltage synthesizer tuning circuit comprises a tuner 2 for tuning in to a broadcasting signal of a radio frequency RF received at an antenna 1 and for converting the radio frequency RF into an intermediate frequency IF, a pre-amplifier 3 for amplifying the broadcasting signal of the intermediate frequency IF from the tuner 2 to a voltage level suitable for signal processing, a surface acoustic wave (SAW) filter 4 for filtering the broadcasting signal amplified by the pre-amplifier 3 at a desired frequency band, and a demodulator 5 for demodulating an output signal from the surface acoustic wave filter 4 to detect a video signal therefrom. The tuning circuit further comprises a video signal processor 6 for amplifying and processing the video signal received from the demodulator 5 and for outputting the processed video signal externally, a synchronous signal detector 7 for detecting a synchronous signal from the video signal output from the video signal processor 6, a microcomputer 8 for controlling the entire operation of the voltage synthesizer tuning circuit in response to the synchronous signal from the synchronous signal detector 7, and for receiving an automatic fine tuning signal AFT from the demodulator 5, and a tuner driver 9 for outputting a voltage corresponding to a pulse width modulation signal PWM from the microcomputer 8 to the tuner 2.

The operation of the voltage synthesizer tuning circuit with the above-described construction in accordance with the present invention will hereinafter be described in detail with reference to FIGS. 6 to 9.

Figure 1:
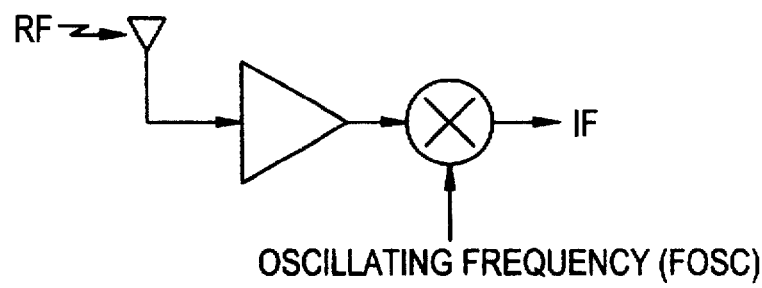
FIG. 1 is a schematic block diagram illustrating the general channel tuning principle.
Figure 2A:
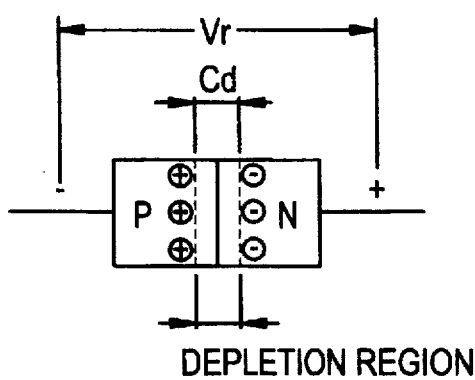
FIG. 2A illustrates the construction of a variable capacitance diode used in the channel tuning principle illustrated in FIG. 1.
Figure 2B:
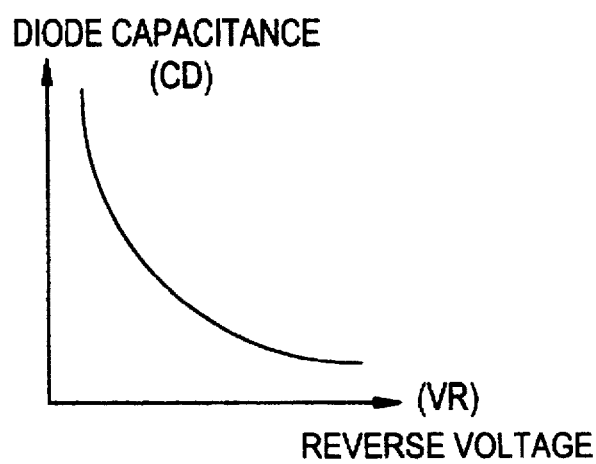
FIG. 2B is a graph illustrating a capacitance characteristic of the variable capacitance diode in FIG. 2A.
Figure 3:
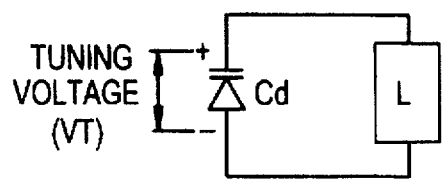
FIG. 3 is a circuit diagram illustrating the oscillating frequency generation principle of a tuner employing the variable capacitance diode in FIG. 2A.
Figure 4:
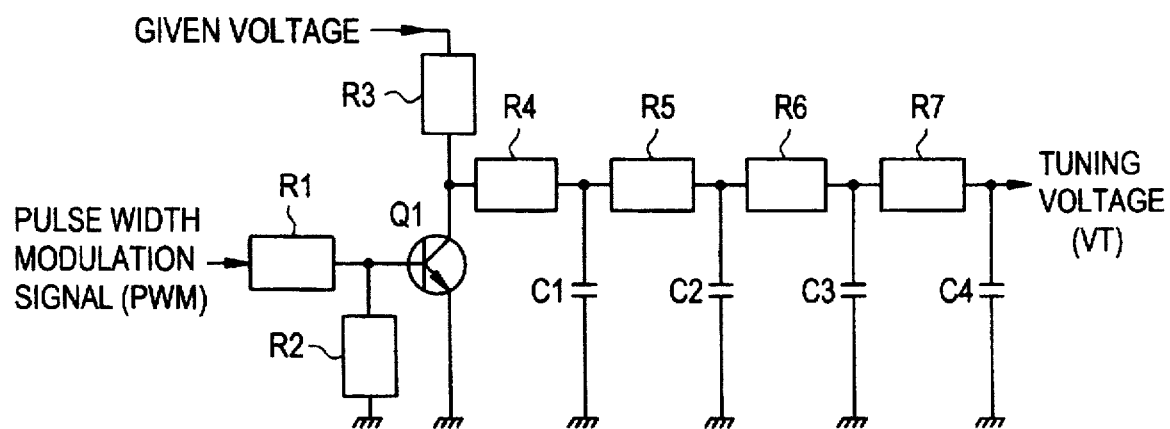
FIG. 4 is a circuit diagram illustrating an example of a tuner driver which drives the tuner illustrated in FIG. 3.

Initially, the microcomputer 8 outputs a pulse width modulation signal PWM to the tuner driver 9 to allow the tuner 2 to generate an oscillating frequency fosc necessary to the channel tuning operation. Upon receiving the pulse width modulation signal PWM from the microcomputer 8, the tuner driver 9 outputs a tuning voltage VT corresponding to the received pulse width modulation signal PWM to the tuner 2 to drive it (see FIG. 4).

As the tuner 2 is driven in response To the tuning voltage VT from the tuner driver 9, it generates the oscillating frequency fosc. When a received broadcasting signal of a radio frequency RF is synchronized with the oscillating frequency fosc, the tuner 2 converts the radio frequency RF into an intermediate frequency IF. The broadcasting signal of the intermediate frequency IF output from the tuner 2 is supplied to the demodulator 5 through the preamplifier 3 and the surface acoustic wave filter 4. The demodulator 5 demodulates the received broadcasting signal to detect a color video baseband signal CVBS therefrom. The video signal processor 6 amplifies and processes the video signal from the demodulator 5 and outputs the processed video signal as an output signal.

The video signal from the video signal processor 6 is also supplied to the synchronous signal detector 7, which detects a synchronous signal from the received video signal and supplies the detected synchronous signal to the microcomputer 8.

Upon receiving the synchronous signal from the synchronous signal detector 7, the microcomputer 8 determines that the broadcasting signal has been received and controls the pulse width modulation signal PWM in response to the automatic fine tuning signal AFT output from the demodulator 5 until the channel tuning operation is performed. Then, the microcomputer 8 ends the channel tuning operation.

Table 2 shows the pulse width modulation data PWM which are supplied from the microcomputer 8 to the tuner driver 9.

TABLE 2

| BAND | RECEPTION CHANNEL | ΔPWM | STEP |
|---|---|---|---|
| VHF-LOW | E02–S10 | ΔPWM(L1) | STEP(L1) |
| | | ΔPWM(L2) | STEP(L2) |
| | | ΔPWM(L3) | STEP(L3) |
| VHF-HIGH | E05–S41 | ΔPWM(H1) | STEP(H1) |
| | | ΔPWM(H2) | STEP(H2) |
| | | ΔPWM(H3) | STEP(H3) |
| UHF | 21–69 | ΔPWM(U1) | STEP(U1) |
| | | ΔPWM(U2) | STEP(U2) |
| | | ΔPWM(U3) | STEP(U3) |

As seen from Table 2, the pulse width modulation signal PWM from the microcomputer 8 can be expressed as follows:

$$PWM(L1) \times STEP(L1) + PWM(L2) \times STEP(L2) + PWM(L3) \times STEP(L3) = PWM(H1) \times STEP(H1) + PWM(H2) \times STEP(H2) + PWM(H3) \times STEP(H3) = PWM(U1) \times STEP(U1) + PWM(U2) \times STEP(U2) + PWM(U3) \times STEP(U3).$$

In Table 2, data PWM is divided into three steps as units of bandwidth to obtain a linear channel tuning operation against a nonlinear capacitance characteristic of a variable capacitance diode. The value of data PWM is experimentally obtained for the optimization of the channel tuning operation corresponding to the average error value of the variable capacitance diode.

On the other hand, as stated previously, the object of the present invention is to tune video channels in the same fashion as that of the frequency synthesizer tuning method F/S using the voltage synthesizer tuning circuit. First, the channel tuning operation in the frequency synthesizer tuning circuit F/S will hereinafter be described. The oscillating frequency fosc can be expressed by the following equation:

$$fosc = fr \times 8 \ (32M+S)$$

where, fr is a reference frequency (NTSC=4.0 MHz/512 and PAL=3.2 MHz/512), M is a 9-bit main counter and S is a 5-bit swallow counter.

That is, in the frequency synthesizer tuning method F/S, the oscillating frequency fosc necessary for the channel tuning operation can be obtained at once on the basis of data of the main and swallow counters.

In the voltage synthesizer tuning method V/S, pulse width modulation data PWM DATA corresponds to the data of the main and swallow counters. The pulse width modulation data PWM DATA is provided with PWM and STEP. The tuner driver 9 in FIG. 4 outputs the tuning voltage VT to the tuner 2 in response to the pulse width modulation data PWM DATA, thereby allowing the tuner 2 to generate the oscillating frequency fosc.

However, in the voltage synthesizer tuning method V/S, the oscillating frequency fosc necessary for the channel tuning operation cannot be obtained immediately because of an error which occurs in the variable capacitance diode and an error of a low pass filter in the tuner driver 9. For this reason, the object of the present invention is to perform the channel tuning operation based on the voltage synthesizer tuning method V/S using the concept of the frequency synthesizer tuning method F/S.

Figure 6:
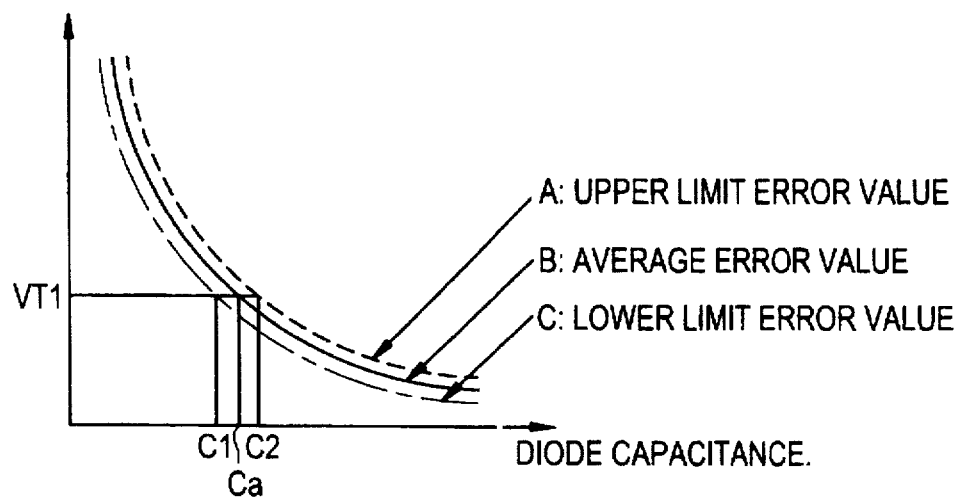
FIG. 6 is a graph illustrating a variation of a tuning voltage with an error of the variable capacitance diode in FIG. 2A.

FIG. 6 is a graph illustrating a variation of the tuning voltage VT with the error of the variable capacitance diode. As mentioned above, the error of the variable capacitance diode as shown in FIG. 6 is the most important factor in performing the channel tuning operation in the voltage synthesizer tuning method V/S using the tuner driver 9 of the same characteristic. In other words, when a tuning voltage VT1 corresponding to one pulse width modulation data is reversely biased to the variable capacitance diode, the variable capacitance diode generates different oscillating frequencies fosc because of its error values as follows:

$$(fosc(B)) = \frac{1}{(2\pi LC\alpha)}$$

$$(fosc(A)) = \frac{1}{(2\pi LC2)}$$

$$(fosc(C)) = \frac{1}{(2\pi LC1)}$$

where, fosc(B) is an oscillating frequency based on a characteristic B of the variable capacitance diode. fosc(A) is an oscillating frequency based on a characteristic A of the variable capacitance diode and fosc(C) is an oscillating frequency based on a characteristic C of the variable capacitance diode.

The magnitudes of the oscillating frequencies fosc(B), fosc(A) and fosc(C) can be expressed as follows:

$$fosc(A) < fosc(B) < fosc(C)$$

As a result, the tuner 2 outputs intermediate frequencies IF as follows:

$$IF(A) < IF(B) < IF(C)$$

Errors between the intermediate frequency IF(B) from the tuner 2 and the intermediate frequencies IF(A) and IF(C) from the tuner 2 may be beyond the distributed range of the intermediate frequency IF(B). As a result, in the voltage synthesizer tuning method V/S, the oscillating frequency fosc necessary to the channel tuning operation cannot be obtained immediately.

To solve such a problem, it is preferred to set pulse width modulation data to a format shown below in Table 3 as units of channels.

TABLE 3

| BAND | CHANNEL | PULSE WIDTH MODULATION SIGNAL | PULSE WIDTH MODULATION DATA FORMAT |
|---|---|---|---|
| VHF-LOW | E02 | PWM(E02) | $\Delta$PWM(L1) × A |
|  | E03 | PWM(E03) | $\Delta$PWM(L1) × B |
|  | ... | ... | ... |
|  | S10 | PWM(S10) | $\Delta$PWM(L1) × STEP(L1) + $\Delta$PWM(L2) × STEP(L2) + $\Delta$PWM(L3) × C |
| VHF-HIGH | E05 | PWM(E05) | $\Delta$PWM(H1) × D |
|  | E06 | PWM(E06) | $\Delta$PWM(H2) × E |
|  | ... | ... | ... |
|  | S41 | PWM(S41) | $\Delta$PWM(H1) × STEP(H1) + $\Delta$PWM(H2) × STEP(H2) + $\Delta$PWM(H3) × F |
| UHF | 21 | PWM(21) | $\Delta$PWM(U1) × G |
|  | 22 | PWM(22) | $\Delta$PWM(U2) × H |
|  | ... | ... | ... |
|  | 69 | PWM(69) | $\Delta$PWM(U1) × STEP(U1) + $\Delta$PWM(U2) × STEP(U2) + $\Delta$PWM(U3) × I |

Where, A to I are constants.

As seen from Table 3, the pulse width modulation data is digitized as units of channels. Also, the value of the pulse width modulation data is experimentally obtained on the basis of the average error characteristic of the variable capacitance diode.

The operation of the present invention as mentioned above will hereinafter be described in more detail with reference to an example.

For example, assume that E02, E06 and 69 are tuning channels desired when television receivers are produced in a television manufacturing plant.

I) First, assume that the average error characteristic of the variable capacitance diode is applied to the tuner 2 to tune it to the desired channels.

1) The microcomputer 8 outputs the pulse width modulation data PWM(E02) shown in Table 3 and, in turn, performs the automatic fine tuning operation. Then, the microcomputer 8 stores the tuned channel in a memory.

2) The microcomputer 8 outputs the pulse width modulation data PWM(E06) shown in Table 3 and, in turn, performs the automatic fine tuning operation. Then, the microcomputer 8 stores the tuned channel in the memory.

3) The microcomputer 8 outputs the pulse width modulation data PWM(69) shown in Table 3 and, in turn, performs the automatic fine tuning operation. Then, the microcomputer 8 stores the tuned channel in the memory.

II) Next, assume that the upper limit error characteristic of the variable capacitance diode is applied to the tuner 2 to tune it to the desired channels. In this case, the channel E02 cannot be tuned although the microcomputer 8 outputs the pulse width modulation data PWM (E02) shown in Table 3 and, in turn, performs the automatic fine tuning operation, as in the above case I). The channel E02 cannot be tuned because the oscillating frequency fosc(E02) based on the pulse width modulation data PWM(E02) is varied according to the error characteristic of the variable capacitance diode. This problem can be solved as follows:

1) The microcomputer 8 increments the pulse width modulation data from the beginning in the same manner as the existing method until the channel E02 is tuned.

2) The microcomputer 8 performs the automatic fine tuning operation with respect to the channel E02 and compares the resultant pulse width modulation data with the pulse width modulation data PWM(E02) to obtain an error value. At this time, the following relationship is defined:

upper limit value of pulse width modulation data PWM (E02)>pulse width modulation data PWM(E02)+α.

The reason that the E02 channel cannot be tuned is because an error in the variable capacitance diode.

3) The microcomputer 8 outputs a value (PWM(E06)+α) obtained by adding α to the pulse width modulation data PWM(E06) shown in Table 3 and, in turn, performs the automatic fine tuning operation. Then, the microcomputer 8 stores the tuned channel in the memory.

4) The microcomputer 8 outputs a value (PWM(69)+α) obtained by adding α to the pulse width modulation data PWM(69) shown in Table 3 and, in turn, performs the automatic fine tuning operation. Then, the microcomputer 8 stores the tuned channel in the memory.

Therefore, the channel tuning time can be significantly reduced in the manufacturing process as compared with the existing method.

III) Finally, assume that the lower limit error characteristic of the variable capacitance diode is applied to the tuner 2 to tune it to the desired channels. In this case, the channel tuning operation is performed in the same manner as that in the above case II).

1) The microcomputer 8 increments the pulse width modulation data from the beginning in the same manner as the existing method until the channel E02 is tuned.

2) The microcomputer 8 performs the automatic fine tuning operation with respect to the channel E02 and compares the resultant pulse width modulation data with the pulse width modulation data PWM(E02). At this time, the following relationship is defined:

lower limit value of pulse width modulation data PWM (E02)<pulse width modulation data PWM(E02)-β.

The reason that the E02 channel cannot be tuned is because an error in the variable capacitance diode.

3) The microcomputer 8 outputs a value (PWM(E06)-β) obtained by subtracting β from the pulse width modulation data PWM(E06) shown in Table 3 and, in turn, performs the automatic fine tuning operation. Then, the microcomputer 8 stores the tuned channel in the memory.

4) The microcomputer 8 outputs a value (PWM(69)-β) obtained by subtracting β from the pulse width modulation data PWM(69) shown in Table 3 and, in turn, performs the automatic fine tuning operation. Then, the microcomputer 8 stores the tuned channel in the memory.

Therefore, the channel tuning time can be significantly reduced in the manufacturing process as compared with the existing method.

Figure 7:
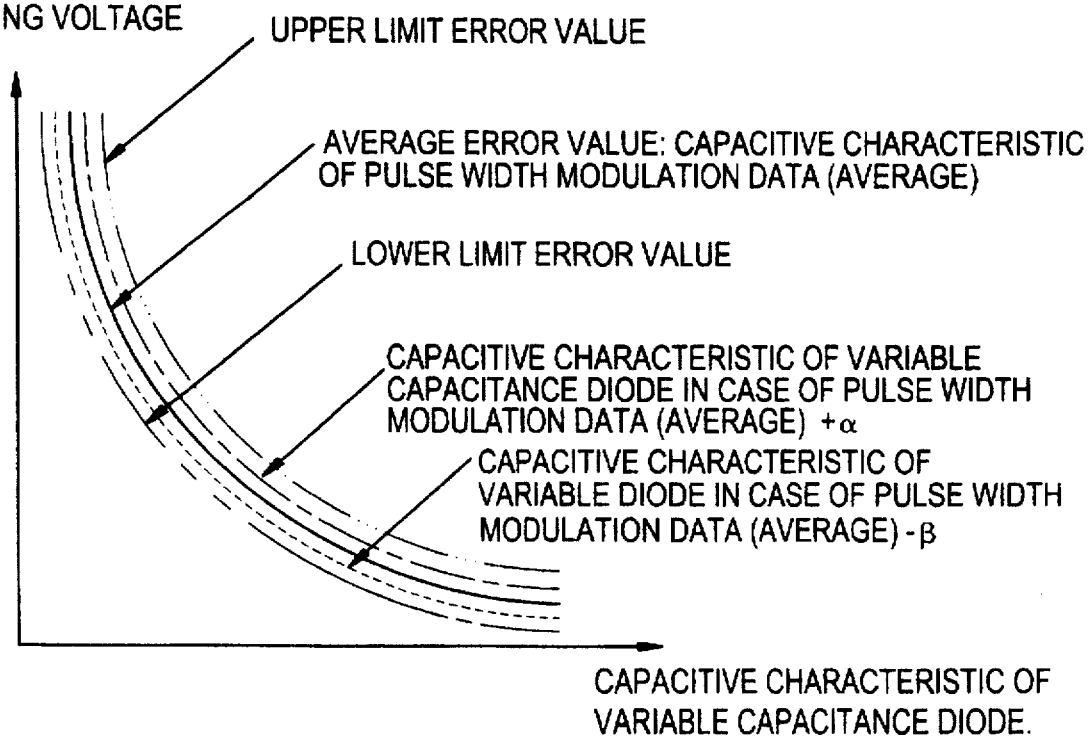
FIG. 7 is a graph illustrating the relationship between a capacitance characteristic of the variable capacitance diode in FIG. 2A and the tuning voltage based on α and β.

FIG. 7 is a graph illustrating the relationship between the capacitance characteristic of the variable capacitance diode and the tuning voltage based on α and β, and FIG. 8 is a graph illustrating the relationship between the pulse width modulation data and the tuning voltage based on α and β. As shown in these drawings, α and β are constants corresponding to 40 steps. That is, the pulse width modulation data can be varied up to ±40 steps when the automatic fine tuning operation is performed after one channel is tuned.

FIG. 9 is a flowchart illustrating the operation of the microcomputer 8 in FIG. 5.

1) At step S1, the microcomputer 8 increments the pulse width modulation data from the beginning in the same manner as the existing method until the initial channel is tuned.

2) The microcomputer 8 performs the automatic fine tuning operation and at steps S2 and S3 compares the resultant pulse width modulation data with those in the case where the average error characteristic of the variable capacitance diode is applied to the tuner 2, as shown in Table 3. Namely, the microcomputer 8 determines at step S2 whether the pulse width modulation data of the initial channel is greater than the average pulse width modulation data of the initial channel +α or at step S3 whether the pulse width modulation data of the initial channel is smaller than the average pulse width modulation data of the initial channel −β.

3) As a result of the comparison, the microcomputer 8 outputs a value obtained by adding α to the average pulse width modulation data of the corresponding channel at step S6, the average pulse width modulation data of the corresponding channel at step S4 or a value obtained by subtracting β from the average pulse width modulation data of the corresponding channel at step S5. In this manner, the channel tuning operation is performed.

As is apparent from the above description, according to the present invention, the concept of a frequency synthesizer tuning method is introduced in broadcasting reception devices utilizing the voltage synthesizer tuning method. Therefore, the channel tuning time can be reduced, resulting in an increase in the efficiency of production and a reduction in the cost. Further, the tuned channel frequency is displayed on the screen. This is convenient to the user.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for tuning to channels in a voltage synthesizer tuning circuit, comprising the steps of:

setting pulse width modulation data corresponding to an average error value of a variable capacitance diode;

tuning to an initial channel on the basis of an average value of said pulse width modulation data;

performing an automatic fine tuning while varying said pulse width modulation data to obtain resultant pulse width modulation data;

comparing said average value of said pulse width modulation data with an average value of said resultant pulse width modulation data to determine an error of said variable capacitance diode;

correcting said pulse width modulation data in accordance with a correction value corresponding to the error determined when said automatic fine tuning operation is performed;

outputting corrected pulse width modulation data to a tuner driver; and tuning to a subsequent channel on the basis of said corrected pulse width modulation data.

2. The method as claimed in claim 1, further comprising the steps of:

storing said pulse width modulation data and said corrected pulse width modulation data in a memory; and outputting said corrected pulse width modulation data so that the subsequent channel can be tuned.

3. A method for tuning in to channels in a voltage synthesizer tuning circuit, comprising the steps of:

setting pulse width modulation data corresponding to an average error value of a variable capacitance diode;

tuning to an initial channel on the basis of an average value of said pulse width modulation data;

performing an automatic fine tuning operation while varying said pulse width modulation data to obtain resultant pulse width modulation data;

comparing said average value of said pulse width modulation data with an average value of said resultant pulse width modulation data to determine an error of said variable capacitance diode;

correcting said pulse width modulation data in accordance with a correction value corresponding to the error determined when said automatic fine tuning operation is performed;

outputting corrected pulse width modulation data to a tuner driver;

tuning to a subsequent channel on the basis of said corrected pulse width modulation data;

storing said pulse width modulation data and said corrected pulse width modulation data in a memory;

outputting said corrected width modulation data from said memory so that the subsequent channel can be tuned; and displaying a frequency of the tuned channel on a screen.

* * * * *